United States Patent
Mughal et al.

(10) Patent No.: US 6,756,810 B2
(45) Date of Patent: Jun. 29, 2004

(54) APPARATUS AND METHOD TO PROVIDE A SINGLE REFERENCE COMPONENT FOR MULTIPLE CIRCUIT COMPENSATION USING DIGITAL IMPEDANCE CODE SHIFTING

(75) Inventors: Usman A. Mughal, Hillsboro, OR (US); Razi Uddin, Orangevale, CA (US); Chee How Lim, Hillsboro, OR (US); Steven A. Peterson, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/360,268

(22) Filed: Feb. 6, 2003

(65) Prior Publication Data

US 2003/0112050 A1 Jun. 19, 2003

Related U.S. Application Data

(62) Division of application No. 09/861,158, filed on May 17, 2001, now Pat. No. 6,545,522.

(51) Int. Cl.[7] .......................................... H03K 19/0185
(52) U.S. Cl. ........................................ 326/30; 327/108
(58) Field of Search ..................... 326/30, 86; 327/108, 327/109

(56) References Cited

U.S. PATENT DOCUMENTS

| | | | |
|---|---|---|---|
| 4,628,276 A | 12/1986 | Mizutani | |
| 4,719,369 A | 1/1988 | Asano et al. | |
| 5,194,765 A | 3/1993 | Dunlop et al. | |
| 5,254,883 A | 10/1993 | Horowitz et al. | |
| 5,666,078 A | * 9/1997 | Lamphier et al. | ........... 327/108 |
| 5,844,913 A | 12/1998 | Hassoun et al. | |
| 5,955,894 A | * 9/1999 | Vishwanthaiah et al. | ..... 326/86 |
| 6,064,224 A | 5/2000 | Esch, Jr. et al. | |
| 6,087,847 A | 7/2000 | Mooney et al. | |
| 6,278,300 B1 | 8/2001 | Urakawa | |
| 6,300,798 B1 | 10/2001 | Possley | |
| 6,307,791 B1 | * 10/2001 | Otsuka et al. | ......... 365/189.05 |
| 6,316,957 B1 | 11/2001 | Ang et al. | |
| 6,535,047 B2 | 3/2003 | Mughal et al. | |

* cited by examiner

*Primary Examiner*—Daniel D. Chang
(74) *Attorney, Agent, or Firm*—Blakely, Sokoloff, Taylor & Zafman LLP

(57) ABSTRACT

A single external impedance element is used to perform multiple circuit compensation. A reference impedance code is first generated based on matching an internal impedance generated by transistors with an impedance of the external impedance element, and then the reference impedance code can be shifted to generate new impedance codes according to impedance requirements of various different circuits that require compensation. Use of the single external impedance element for compensation of multiple circuits reduces motherboard and packaging costs. Chip area is also conserved since simpler compensation circuits can be used.

9 Claims, 3 Drawing Sheets

APPARATUS AND METHOD TO PROVIDE A SINGLE REFERENCE COMPONENT FOR MULTIPLE CIRCUIT COMPENSATION USING DIGITAL IMPEDANCE CODE SHIFTING

CROSS REFERENCE TO RELATED APPLICATIONS

This application is a divisional of, and claims priority from, U.S. patent application Ser. No. 09/861,158, filed May 17, 2001, now U.S. Pat. No. 6,545,522 and currently pending.

TECHNICAL FIELD

This disclosure relates generally to electronic devices, and in particular but not exclusively, relates to use of a single reference component to provide multiple circuit compensation by using digital impedance code shifting.

BACKGROUND

Because high-frequency processors are becoming more sensitive to variations in process, supply voltage, and temperature (P-V-T), it becomes prudent to compensate critical circuits for these variations. For example, on-die termination circuits, input/output (I/O) pre-driver circuits, timing control circuits, etc. are compensated because they affect overshoots, undershoots, signal reflections, timing control (Tco), and signal edge rates. Comparing a resistance of an external resistor to the resistance of an internal compensation circuit is the basis for compensating these critical circuits. Accordingly, for each kind of circuit (e.g., on-die termination circuit, I/O pre-driver circuit, Tco circuit, etc.), a separate external resistor is used to compensate each of the required circuit attributes (such as impedance, slew rate, and timing).

FIG. 1 is a schematic diagram of a circuit compensation technique that uses multiple external resistors. The technique shown in FIG. 1 compensates a critical circuit across P-V-T by using an external resistor R (shown in FIG. 1 as having an example value of 100 Ohms) to match a resistance of a compensation circuit 10 formed on a chip 12. The compensation circuit 10 comprises a plurality of P-channel metal oxide semiconductor (PMOS) transistors, referred to as "transistor legs." In the example of FIG. 1, there are 32 transistor legs.

Matching the on-chip internal resistance of the compensation circuit 10 to the resistance of the external resistor R is done by having a first finite state machine FSM1 turn on the transistor legs one at a time until the effective on-chip internal resistance is approximately equal to the resistance of the external resistor R. At this moment, a comparator circuit 14 (coupled to the external resistor R, to the compensation circuit 10, and to a voltage supply Vdd) trips, and the number of activated transistor legs in the compensation circuit 10 is recorded by the finite state machine FSM1.

From this number of activated transistor legs, a digital impedance code is generated by the finite, state machine FSM1 that represents the matched on-chip internal resistance. The finite state machine FSM1 then provides this impedance code (representing 100 Ohms in the example) to other compensation circuits, such as to other Tco circuits on the chip 12 if the compensation circuit 10 compensated for timing, so that these other compensation circuits can compensate that same circuit attribute.

However, if many different circuits need to be compensated across P-V-T for different circuit attributes, a separate impedance code needs to be generated for each circuit. Thus in FIG. 1, n circuits to be compensated require n external resistors Rx. As is often the case, the resistance of any one of the external resistors Rx (40 Ohms as an example in FIG. 1) needs to be different than the resistance of the external resistor R or the resistances of other external resistors.

As apparent in FIG. 1, compensation of many different circuits requires many additional internal resistors (e.g., additional compensation circuits 16), finite state machines FSMn, comparator circuits 18, etc. The addition of these redundant on-chip components increases fabrication costs and consumes valuable real estate on the chip 12. The use of multiple external resistors R to Rx increases packaging costs and motherboard costs, since multiple pads (e.g., pad 1 to pad n) or pins must be provided, respectively, for the external resistors R to Rx.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of a method and apparatus to provide a single reference component for multiple circuit compensation, via use of impedance code shifting, are described herein. In the following description, numerous specific details are given, such as specific impedance values in FIGS. 2 and 3, to provide a thorough understanding of embodiments of the invention. One skilled in the relevant art will recognize, however, that the invention can be practiced without one or more of the specific details, or with other methods, components, materials, values, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As an overview, an embodiment of the invention provides a more cost-effective technique for multiple circuit compensation using impedance code shifting, such as digital impedance code shifting. A single reference component, in the form of a single reference impedance code corresponding to an internal resistance substantially matched to a resistance of a single external resistor, is used to compensate multiple and different circuit attributes. That is, in an embodiment, the single external resistor is used to compensate various circuits (or circuit attributes) by digitally shifting the reference impedance code according to the impedance requirements of each circuit to be compensated.

Figure 1:
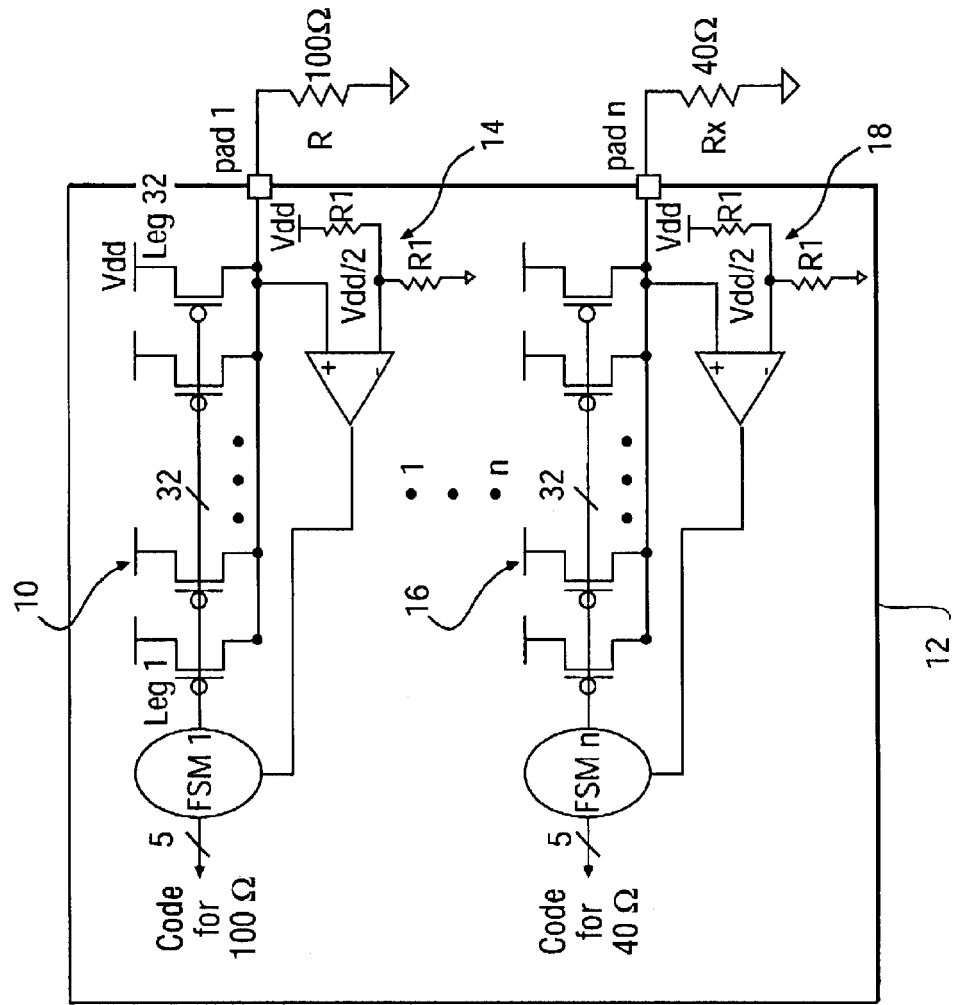
FIG. 1 is a schematic diagram of a circuit compensation technique that uses multiple external resistors.

Packaging costs are decreased since only one extra pin or pad need be used for compensation purposes, as compared to multiple pads for the compensation technique of FIG. 1. Motherboards cost are also decreased since only one external resistor need be used for compensation. An embodiment of the compensation technique also simplifies the circuits used for compensation, and thus results in reduction of chip area usage.

Figure 2:
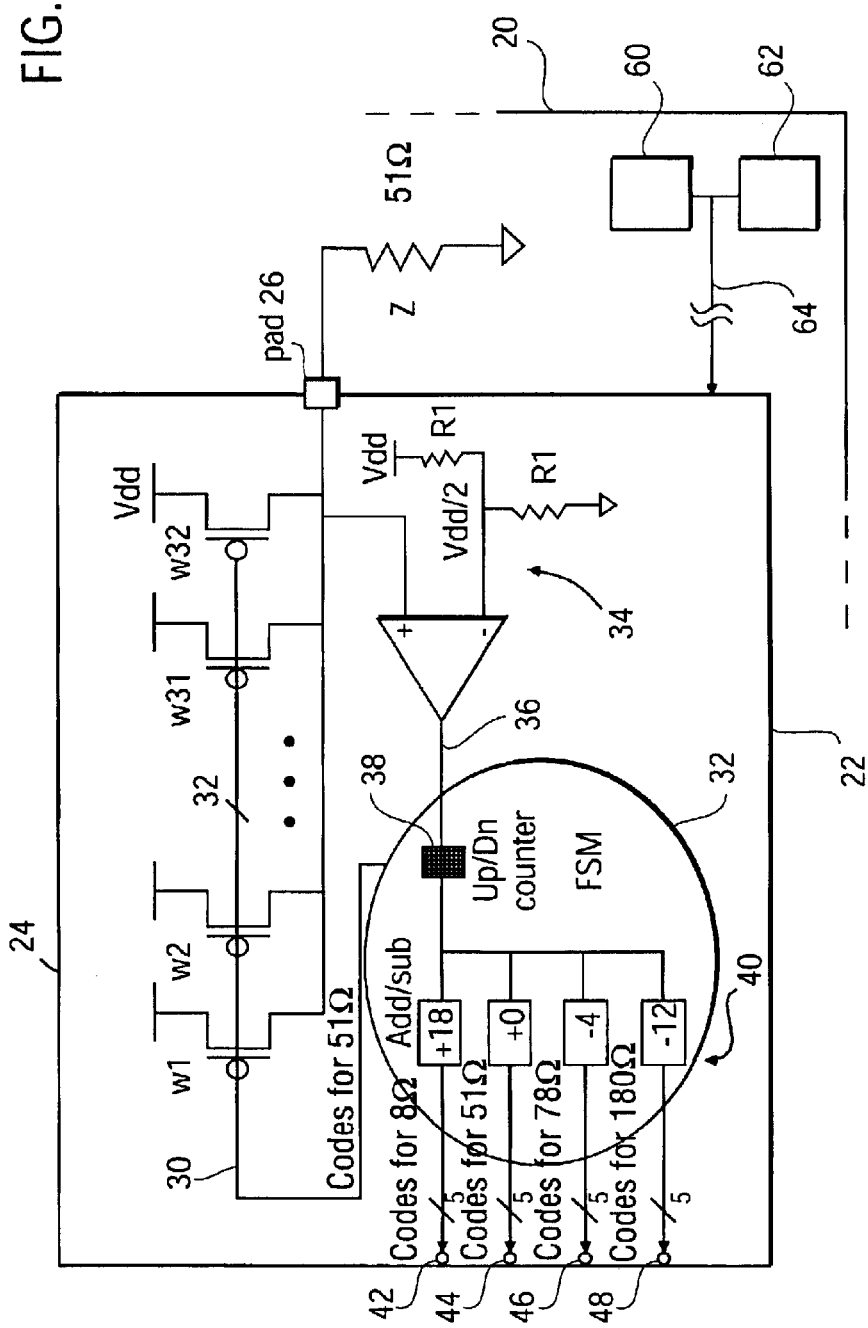
FIG. 2 is a schematic diagram of a circuit compensation technique in accordance with an embodiment of the invention that uses a single external resistor.

FIG. 2 is a schematic diagram of a circuit compensation technique in accordance with an embodiment of the invention that uses a signal external resistor or other single external impedance element Z. The impedance element Z may be mounted on a motherboard 20. For purposes of illustration and explanation, the impedance element Z will be described herein as having a resistance of 51 Ohms. It is to be appreciated that this resistance value is merely an example and may be different in other embodiments. For the sake of discussion, the 51-Ohm resistance of the impedance element Z can be associated with an on-die termination circuit for a uni-processor system, although it may be associated with other different types of circuits, such as I/O pre-driver circuits, Tco circuits, on-die termination circuits for multi-processor systems, or other circuits.

A chip 22 is mounted on or otherwise coupled to the motherboard 20. At least one compensation circuit 24 is formed on the chip 22. In an embodiment, the compensation circuit 24 comprises a plurality of impedance-generation devices, shown in FIG. 2 as a plurality of PMOS transistors or transistor legs. For the sake of illustration, 32 transistor legs w1–w32 are shown in the embodiment of FIG. 2. It is to be appreciated that other compensation circuits on the chip 22 or other embodiments can have any number of transistor legs. Moreover, while the embodiment shown in FIG. 2 uses PMOS transistors in the compensation circuit 24, other embodiments or other compensation circuits on the chip 22 can be implemented with N-channel metal oxide semiconductor (NMOS) transistors. In such NMOS implementations, a person skilled in the art having the benefit of this disclosure can re-configure the compensation circuit 24 so that the NMOS transistors are connected as impedance-generation devices. In yet another embodiment, a combination of NMOS and PMOS transistors may be present in the compensation circuit 24.

Source terminals of the transistor legs w1–w32 are coupled to a voltage source Vdd. Their drain terminals are coupled to the external impedance element Z by or at a pad 26. Their gate terminals are coupled by a bus 30 to a control circuit 32, which will be described later below. In the example of FIG. 2, there are 32 lines in the bus 30, corresponding to each of the transistor legs w1–w32.

The transistor legs w1–w32 can be associated to or correspond to a circuit attribute, such as on-die termination, I/O pre-driver strength, timing control slew rate, signal edge rate control, or other circuit attribute that can be compensated. For purposes of discussion herein, the transistor legs w1–w32 will be associated to compensation for the on-die termination circuit attribute for a uni-processor system.

A comparator circuit 34 is coupled to the impedance element Z and to the plurality of PMOS transistors in the compensation circuit 24. An output terminal 36 of the comparator circuit 34 is coupled to the control circuit 32, which in one embodiment includes a finite state machine FSM. An embodiment of the control circuit 32 also includes a counter 38 (such as an up/down counter). The counter 38 is coupled to the output terminal 36 of the comparator circuit 34, and is also coupled to the gate terminals of the PMOS transistors in the compensation circuit 24 via the bus 30.

In operation, the control circuit 32 first generates a reference impedance code. This is done by having the control circuit 32 activate the transistor legs w1–w32 one at a time until the impedance (or conductance) of the activated transistor legs substantially matches the resistance/impedance of the external impedance element Z, which in this example is 51 Ohms. Once there is a substantial match of impedances, the comparator circuit 34 trips and provides a signal at its output terminal 36 to the control circuit 32. The signal from the comparator circuit 34 causes the control circuit 32 to read the value in the counter 38, which in this case has recorded the number of transistor legs that are activated to match 51 Ohms. In an embodiment, the number provided by the counter 38 is a digital or binary number that the finite state machine FSM (or other component of the control circuit 32) designates or otherwise produces as the reference impedance code that corresponds,to the impedance of the activated transistor legs.

Once the reference impedance code is generated, the finite state machine FSM shifts the reference impedance code up or down to generate other impedance codes to compensate for other different circuit attributes. Examples of amounts of these shifts to compensate other circuit attributes for illustrative purposes include, but are not limited to, an upward shift of 18 to compensate on-die termination for a dual-processor system to 8 Ohms, a downward shift of −4 to compensate edge rate control to 78 Ohms, a downward shift of −12 to compensate for I/O timing control (Tco) to 180 Ohms, and so on. This shifting of the reference impedance code is shown generally at 40 in FIG. 2.

The control circuit 32 has a plurality of output terminals to provide the various values of the shifted reference impedance code (which now are in effect new impedance codes) to other compensation circuits 42–48 corresponding to other different circuit attributes. In accordance with an embodiment of the invention, the counter 38 can at least partly control activation or deactivation of individual impedance-generation devices in these other compensation circuits based on the amount of the shift of the reference impedance code. Therefore, for example, if the impedance code for 8 Ohms is to be provided to the compensation circuit 42, then the counter 38 counts up (e.g., shifts or increments) the value of the reference impedance code by 18. This new impedance code is provided by the control circuit 32, via lines (shown in FIG. 2 as comprising 5 lines, as an illustration, to the compensation circuit 42), to gate terminals of impedance-generation devices of the compensation circuit 42. In response, at least one impedance-generation device of the compensation circuit 42 is activated to provide compensation impedance that corresponds to the received impedance code.

Thus, an embodiment of the invention need utilize only the single external impedance element Z and only a single control circuit 32 (and hence only the single finite state machine FSM and the single comparator circuit 34) for multiple circuit compensation. It is to be appreciated, however, that in other embodiments where motherboard costs, packaging costs, and chip area are less of a concern, additional numbers of these components may be used for multiple circuit. compensation.

It is noted that the embodiment of the compensation circuit 24 shown in FIG. 2 is an example that is based on p-device dependence. Stated in another way, all similar p-devices in similar circuits will turn on the same number of p-devices. Thus, if compensation for a particular on-die termination circuit requires 5 activated p-devices for the proper impedance, all other on-die termination circuits on the same chip 22 will also be compensated by having 5 of their associated p-devices activated. In other embodiments, n-device dependence may be used, or less or no device dependence may be used.

In an embodiment of the invention, the PMOS transistors in the compensation circuit 24 (as well as in other compensation circuits 42–48 on the chip 22) have variable physical widths. These variable widths provide the PMOS transistors with different individual impedances when they are activated. Hence, by designing the total number of PMOS transistors present in each compensation circuit 24 and by selecting the widths of the individual transistors, a range of impedances can be made available and the change in impedance for each shift can be calculated/designed.

The width of each transistor leg in one embodiment can be calculated as $W_n=W_{n-1}+y*W_{n-1}$, where y is the incremental width from one transistor leg to the next transistor leg and where n=1 for the starting width for the first transistor leg. For the specific embodiment shown in FIG. 2 for the PMOS transistors in the compensation circuit 24 or for the compensation circuits 42–48, n is between [2,32] since 32 PMOS transistors are present.

$W_n$ is the total width of the n transistor legs turned on. The resistance/impedance is generally inversely proportional to $W_n$, such that as the number of transistor legs that are turned on increase, the total impedance decreases. The total impedance or resistance can be generally stated as $R_n \approx K/W_n$, where $K=L/(U_n C_{ox} V_{eff})$. In this equation, L is the length, $U_n$ is the mobility, $C_{ox}$ is the gate oxide capacitance, and $V_{eff}$ is the gate-to-source voltage $V_{GS}$ minus the threshold voltage $V_t$ for the transistor legs.

The incremental width y (e.g., "step") from one transistor to another can be 10% (e.g., y=0.1), and it is to be appreciated that y can be a greater or lesser percentage based on the desired amount of precision. For instance, if y is a smaller percentage (including no change in width for PMOS transistors of uniform widths) then shifting from one set of turned-on PMOS transistor legs to another set of PMOS transistor legs results in a smaller change in impedance, and hence more precise impedance adjustment. In such a case, more PMOS transistors may be formed on the chip 22 if a greater range for the total impedance is desired. Conversely, if y is made larger, shifting from one set of turned-on PMOS transistor legs to another set of PMOS transistor legs results in greater impedance changes.

Thus, the PMOS transistors in one embodiment have different widths that correspond to a different impedance that can be generated by each PMOS transistor. A shift in the reference impedance code by the control circuit 32 results in activation or deactivation of PMOS transistors in any one of the compensation circuits 42–48 to generate different impedances based on an amount of the shift.

Figure 3:
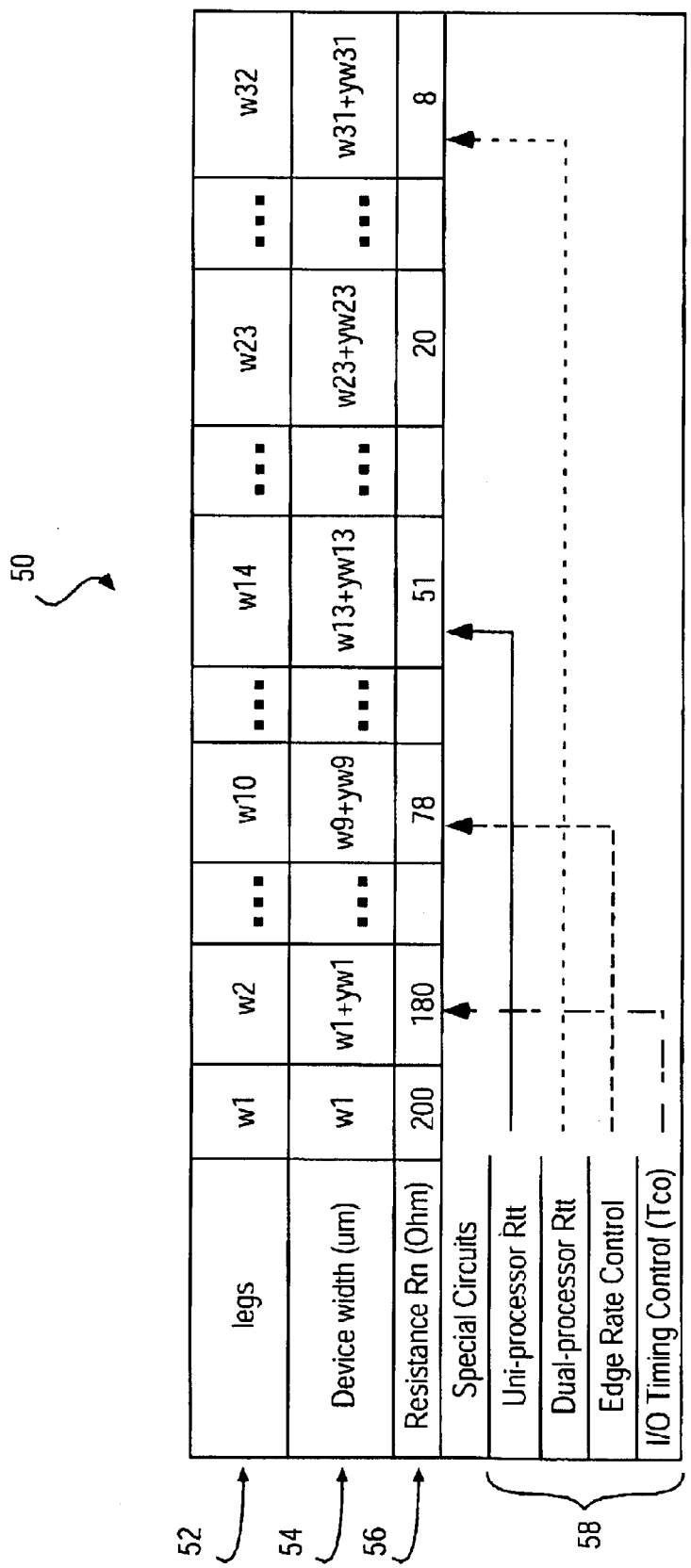
FIG. 3 is a table illustrating an example embodiment of impedance code shifting for the circuit compensation technique of FIG. 2.

FIG. 3 is a table 50 that illustrates an embodiment of impedance code shifting for the compensation technique of FIG. 2. Specifically, the table 50. has entries for the total resistance $R_n$, the transistor legs w1–w32, the amount of shifting for the reference impedance code, and the circuit types (or circuit attributes) to be compensated, and so on that are consistent with what is shown in FIG. 2. For the table of FIG. 3, y has a value of 0.1 for purposes of discussion, meaning that the PMOS transistors in the compensation circuit 24 have a step increase in width of 10% relative to a width of a previous adjacent PMOS transistor. Hence, the resistance $R_n$ decreases by 10% as the PMOS transistors are activated one at a time. It is understood that the entries in the table 50 are merely for explanation and are not necessarily intended to fully reflect actual circuit conditions.

The table 50 identifies the transistor legs w1–w32 at 52. The width(s) $W_n$ of the activated PMOS transistors are indicated at 54, which may have values in microns. The total resistance $R_n$ for the activated transistors is indicated at 56. Hence, the resistance of the first activated PMOS transistor can be 200 Ohms. The resistance of the first and second activated PMOS transistors is thus 200 Ohms minus (0.1) (200 Ohms)=180 Ohms. The remaining values of the total resistance $R_n$ up to the transistor leg w32 can be roughly calculated for the table 50 using this methodology. Examples of various different circuits (or different circuit attributes) to be compensated are shown at 58.

The reference impedance code, corresponding to 51 Ohms in FIG. 2, is shown in the table 50 as corresponding to 14 activated PMOS transistors (e.g., the transistor legs w1 to w14) for compensation of on-die termination (Rtt) for a uni-processor system. If it is known (from design simulation or via other testing technique) that compensation for on-die termination Rtt for a dual-processor system will require 8 Ohms and hence 32 activated transistor legs, the reference impedance code corresponding to 51 Ohms (14 activated transistor legs) is shifted upward (e.g., to the right in the table 50 by adding 18 to the reference impedance code) to generate a new impedance code to activate the transistor legs w1 to w32.

For downward shifting to obtain a higher resistance, such as to compensate for edge rate control at 78 Ohms, the reference impedance code is shifted to the left (e.g., the reference impedance code is subtracted by 4) so that a new impedance code to activate the transistor legs w1 to w10 is generated. For obtaining an even greater compensation resistance, such as for I/O timing control at 180 Ohms, the reference impedance code is shifted to the left (e.g., the reference impedance code is subtracted by 12) such that an impedance code to activate the transistor legs w1 and w2 is generated. Thus, via reference code shifting, the required compensation impedance codes for other circuits are obtained.

In an embodiment, multiple circuit compensation may be performed on a regular basis, so that circuit compensation can be continuously updated. This updating can involve monitoring circuit conditions, and then repeating the shifting of the reference impedance code and repeating the using of the shifted reference impedance code to activate or deactivate at least one or more PMOS transistor legs in a particular compensation circuit. This repeating can thus be performed in response to a change in state of a circuit attribute, such as a change due to P-V-T for impedance, slew rate, timing control, and the like, to deactivate or activate impedance-generation devices in any of the compensation circuits identified above.

Referring again to FIG. 2, the control circuit 32 may be controlled by instructions (such as software or other machine readable code) to perform the various shifting, PMOS transistor activation/deactivation, or other operations described above, in response to a state of a particular circuit attribute. Such instructions may be stored on a machine-readable medium 60 coupled to or mounted on the motherboard 20 (or on the chip 22). In one embodiment, these instructions can be executed by a processor 62. Both the processor 62 and the machine-readable medium 60 can be connected to each other and to components on the chip 22 via a bus 64. In an embodiment, the multiple circuit compensation described above can be performed as part of a basic input/output system (BIOS) routine during startup, or may be performed at other times by other routines.

In conclusion, an embodiment of the invention uses the single external impedance element Z to perform multiple circuit compensation. A reference impedance code is first generated, and then the reference impedance code can be incremented or decremented (e.g., shifted) to generate new impedance codes according to impedance requirements of various different circuits that require compensation. Using the single external impedance element for compensation of multiple circuits reduces motherboard and packaging costs. Furthermore, chip area is also conserved since simpler compensation circuits can be used.

The above description of illustrated embodiments of the invention including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An article of manufacture, comprising:
    a machine-readable medium having stored thereon instructions to:
        activate at least one of a first plurality of impedance-generation devices associated to a first circuit attribute, until an impedance of the activated impedance-generation devices substantially matches art impedance of a single external impedance element;
        based on a number of the activated impedance-generation devices, generate a reference impedance code corresponding to the impedance of the activated impedance-generation devices;
        shift the reference impedance code by a first amount to generate a first shifted reference impedance code; and
        use the first shifted reference impedance code to activate at least one of a second plurality of impedance-generation devices to generate an impedance associated with a second circuit attribute different from the first circuit attribute associated with the first plurality of transistors.

2. The article of manufacture of claim 1 wherein the instructions to shift the reference impedance code include instructions to increment or decrement a counter.

3. The article of manufacture of claim 1 wherein the second plurality of impedance-generation devices comprises transistors having different widths that correspond to a different resistance generated by each transistor, and wherein the instructions to shift the reference impedance code and to use the first shifted reference impedance code to activate at least one of the second plurality of transistors result in generation of different resistances based on the first amount of the shift.

4. The article of manufacture of claim 1 wherein the machine-readable medium further includes instructions stored thereon to repeat the shifting of the reference impedance code and to repeat the using of the first shifted reference impedance code to activate at least one of the second plurality of impedance-generation devices to generate a new impedance, in response to a change in state of the second circuit attribute.

5. The article of manufacture of claim 1 wherein the instructions stored on the machine-readable medium are executable by a processor as part of a basic input/output system (BIOS) routine.

6. The article of manufacture of claim 1 wherein the instructions to use the first shifted reference impedance code to activate at least one of the second plurality of impedance-generation devices to generate the impedance associated with the second circuit attribute include instructions to generate the impedance associated with the second circuit attribute to compensate the second circuit attribute.

7. The article of manufacture of claim 6 wherein the machine-readable medium further includes instructions stored thereon to:
    shift the reference impedance code by a second amount different from the first amount to generate a second shifted reference impedance code.

8. The article of manufacture of claim 7 wherein the machine-readable medium further includes instructions stored thereon to use the second shifted reference impedance code to compensate a third circuit attribute different from the first and second circuit attributes.

9. The article of manufacture of claim 8 wherein the instructions to use the second shifted reference impedance code to compensate the third circuit attribute further comprise instructions to activate at least one of a third plurality of impedance generation devices based on the second shifted reference impedance code to generate an impedance associated with the third circuit attribute.

* * * * *

UNITED STATES PATENT AND TRADEMARK OFFICE
CERTIFICATE OF CORRECTION

PATENT NO. : 6,756,810 B2
DATED : June 29, 2004
INVENTOR(S) : Mughal et al.

It is certified that error appears in the above-identified patent and that said Letters Patent is hereby corrected as shown below:

Column 4,
Line 22, delete "corresponds,to" and insert -- corresponds to --.

Column 7,
Line 42, delete "art" and insert -- an --.

Signed and Sealed this

Thirtieth Day of November, 2004

JON W. DUDAS
*Director of the United States Patent and Trademark Office*